United States Patent [19]
Zhang

[11] Patent Number: 5,681,759
[45] Date of Patent: Oct. 28, 1997

[54] METHOD OF FABRICATING SEMICONDUCTOR DEVICE

[75] Inventor: Hongyong Zhang, Kanagawa, Japan

[73] Assignee: Semiconductor Energy Laboratory Co., Ltd., Kanagawa, Japan

[21] Appl. No.: 388,845

[22] Filed: Feb. 15, 1995

[30] Foreign Application Priority Data

Feb. 15, 1994 [JP] Japan .................. 6-040523

[51] Int. Cl.⁶ .................. H01L 21/265
[52] U.S. Cl. .......... 437/21; 437/40 TFT; 437/41 TFT; 437/101; 437/173; 437/174; 437/247
[58] Field of Search .................. 437/173, 174, 437/247, 21, 101, 40 TFT, 41 TFT; 148/DIG. 3, DIG. 4

[56] References Cited

U.S. PATENT DOCUMENTS

| | | | |
|---|---|---|---|
| 4,566,913 | 1/1986 | Brodsky et al. | 437/247 |
| 4,670,063 | 6/1987 | Schachameyer et al. | 437/247 |
| 4,762,801 | 8/1988 | Kapoor | 437/247 |
| 5,192,708 | 3/1993 | Beyer et al. | 437/247 |
| 5,219,786 | 6/1993 | Noguchi | 437/247 |
| 5,372,958 | 12/1994 | Miyasaka et al. | 437/247 |
| 5,583,369 | 12/1996 | Yamazaki et al. | 257/66 |

FOREIGN PATENT DOCUMENTS 61-113771  5/1986  Japan .

*Primary Examiner*—Charles L. Bowers, Jr.
*Assistant Examiner*—Ramamohan Rao Paladugu
*Attorney, Agent, or Firm*—Sixbey, Friedman, Leedom & Ferguson, PC; Gerald J. Ferguson, Jr.; Jeffrey L. Costellia

[57] ABSTRACT

Method of forming a crystalline silicon film having excellent characteristics. An amorphous silicon film is formed on a substrate having an insulating surface. The amorphous film is thermally annealed at 400°–620° C., preferably at 520°–620° C., more preferably at 550°–600° C., for 1–12 hours. The silicon film is crystallized to a crystallinity of 0.1–99.9%, preferably 1–99%. Then, the silicon film is irradiated with UV laser radiation. Thus, the crystallinity of the silicon film is improved in a short time. Crystalline silicon films having uniform characteristics are obtained.

19 Claims, 3 Drawing Sheets

LASER LIGHT

LASER LIGHT

LASER LIGHT

PTFT    NTFT

METHOD OF FABRICATING SEMICONDUCTOR DEVICE

BACKGROUND OF THE INVENTION

1. Field of the Invention

The present invention relates to a semiconductor device having a non-single-crystal film formed either on an insulating substrate made of glass or the like or on an insulating coating formed on any one of various kinds of substrates. For example, the semiconductor device is a thin-film transistor (TFT), a thin-film diode (TFD), or a thin-film integrated circuit utilizing such thin-film transistors or thin-film diodes. More particularly, the invention relates to a method of fabricating a thin-film integrated circuit for use with an active-matrix liquid crystal display.

2. Description of the Related Art

In recent years, semiconductor devices having TFTs on an insulating substrate made of glass or the like have been developed. Examples of these semiconductor devices include active-matrix liquid crystal displays using TFTs for activating pixels, image sensors, and three-dimensional integrated circuits.

It is common practice to fabricate TFTs used in the device described above from thin-film silicon semiconductors. Thin-film semiconductors are roughly classed into two groups: silicon semiconductors consisting of amorphous silicon (a-Si) semiconductors and crystalline silicon semiconductors. Polycrystalline silicon, silicon crystallites, amorphous silicon containing crystal components, and semi-amorphous silicon having a state midway between crystalline state and an amorphous state are known as crystalline silicon semiconductors.

Amorphous silicon semiconductors are manufactured at low temperatures and relatively easy to fabricate by chemical vapor deposition. Furthermore, they are adapted for mass production. Therefore, they have enjoyed the widest acceptance. However, they are inferior to crystalline silicon semiconductors in physical properties such as mobilities and so there is a strong demand for establishment of a method of fabricating TFTs consisting of a crystalline silicon semiconductor in order to obtain a high speed operation therefrom.

One known method of obtaining a crystalline thin-film silicon semiconductor consists of forming an amorphous semiconductor film and applying thermal energy (i.e., carrying out thermal annealing) for a long time to crystallize the amorphous film. This method is known as solid phase crystal growth (SPC) technique.

Where this technique is used, however, it is usually necessary that the heating temperature be raised above 600° C. Where the crystal growth should be further enhanced, the temperature must be above 640° C. This severely limits the used substrate. Furthermore, the heating time for the crystallization persists for as long as tens of hours. Hence, there is a demand for a process that requires a shortened heating time.

A crystalline silicon film is also obtained by irradiating an amorphous silicon film with UV laser radiation such as an excimer laser radiation. This method is known as laser annealing or laser crystallization. This method requires a relatively short processing time but it is inevitable that obtained TFTs have different characteristics because of instability of the laser output. Hence, it has been very difficult to use this method in practice.

SUMMARY OF THE INVENTION

It is an object of the present invention to provide a method of fabricating a silicon film adapted for fabrication of a semiconductor device which has excellent characteristics and is well suited for mass production, by skillfully exploiting the advantages of both SPC and laser crystallization methods.

In a method according to the present invention, a non-single-crystal silicon film is previously thermally annealed at 400°–620° C., preferably at 520°–620° C., e.g., at 550°–600° C., for 1–12 hours, to drive off hydrogen atoms. In this way, low crystallinity is imparted to the non-single-crystal silicon film, which may be called a quasi-polycrystal. This silicon film is irradiated with UV (ultraviolet) laser radiation to promote the crystal growth. The degree of crystallization (i.e., the ratio of the crystalline regions to the uncrystallized regions) of the silicon film obtained prior to the laser irradiation is preferably 0.1 to 99.9%, more preferably 1–99%. The thermal annealing time differs, depending on the required crystallinity and on the annealing temperature.

UV laser radiation which can be easily used include KrF excimer laser radiation having a wavelength of 248 nm, XeCl excimer laser radiation having a wavelength of 308 nm, ArF excimer laser radiation having a wavelength of 193 nm, and XeF excimer laser radiation having a wavelength of 353 nm. Other usable radiation is the third or fourth harmonic of Nd:YAG laser radiation.

During the laser irradiation, an insulating coating which absorbs not greater than 10% of the used laser light (that is, the insulating coating transmits the ultraviolet laser radiation) may be formed on the silicon film. The existence of the film acts to prevent the surface of the crystal from roughening during the growth promoted by the laser irradiation. The insulating coating is formed after the silicon film forming step or the silicon film thermally annealing step.

Since the amorphous silicon film is opaque to UV radiation, the energy of the radiation is concentrated in the vicinities of the surface at the initial stage of the laser irradiation. For this reason, sufficiently intense laser radiation must be directed to the film to impart energy to the whole film. Such energy is too strong at the surface and so the film may be made amorphous, evaporated, or abraded.

Therefore, when an amorphous silicon film is irradiated with laser radiation to crystallize the film, the optimum value of the laser energy must lie within a quite narrow range. That is, if the energy is lower, the crystallization does not progress. Conversely, if the energy is higher, the film is made amorphous, evaporated, or abraded. Consequently, the prior art laser crystallization technique is not adapted for mass production.

On the other hand, a silicon thin film crystallized to a degree within the crystallinity range from 0.1 to 99.9%, preferably 1 to 99%, is semi-transparent to UV radiation. Under this condition, if the film is irradiated with UV laser light, the energy of the laser light is uniformly absorbed by substantially the whole film. As a result, the crystallinity is not affected by the film thickness and remains constant. In this way, quite uniform characteristics can be obtained.

Since crystallization has progressed to some extent, crystallization will progress further with presently existing crystals as nuclei, simply by adding slight energy. Because some degree of crystallinity exists, a high thermal conductivity is provided. Extra energy can be transferred immediately to other locations. For this reason, the energy necessary for the irradiation can be made lower than the energy necessary for the prior art laser crystallization method.

In order to obtain a silicon film having a crystallinity of 0.1–99.9%, thermal annealing is effected at 400°–620° C., preferably at 520°–620° C., e.g., at 550°–600° C., for 1 to 12 hours. In the present invention, the time taken to carry out the thermal annealing depends on temperature. Where the temperature is 600° C., the thermal annealing time is within 4 hours, which is much shorter than the conventional annealing time of tens of hours. Where the thermal annealing is carried out at a lower temperature, e.g., at 500°–550° C., the thermal annealing time is prolonged. However, the effect on the substrate is reduced sufficiently during the annealing process. This gives a greater degree of freedom to selection of substrate materials.

Other objects and features of the invention will appear in the course of the description thereof, which follows.

DESCRIPTION OF THE PREFERRED EMBODIMENTS

EXAMPLE 1

Figure 1A:
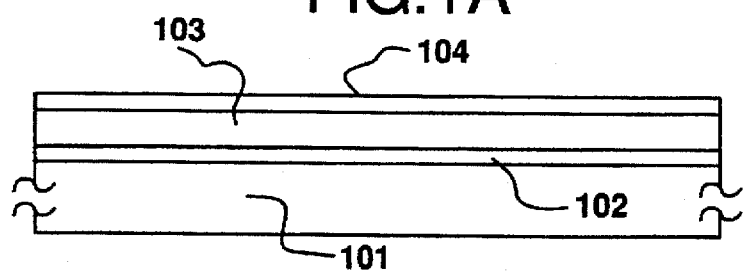
FIGS. 1(A)–1(D) are cross sections illustrating the fabrication sequence of Example 1 of a method according to the invention, for fabricating TFTs.
Figure 1B:
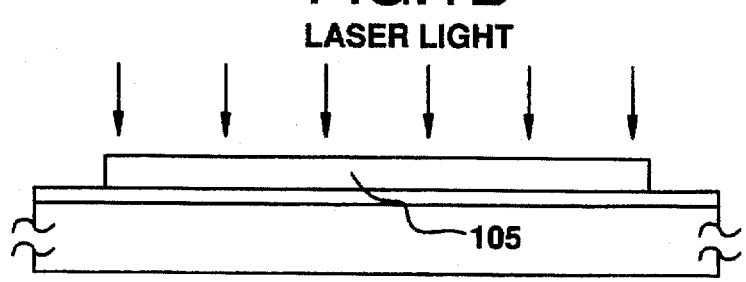
Figure 1C:
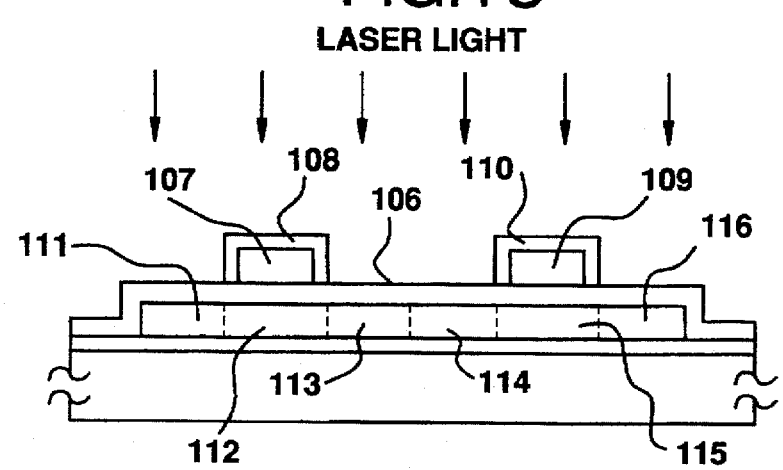
Figure 1D:
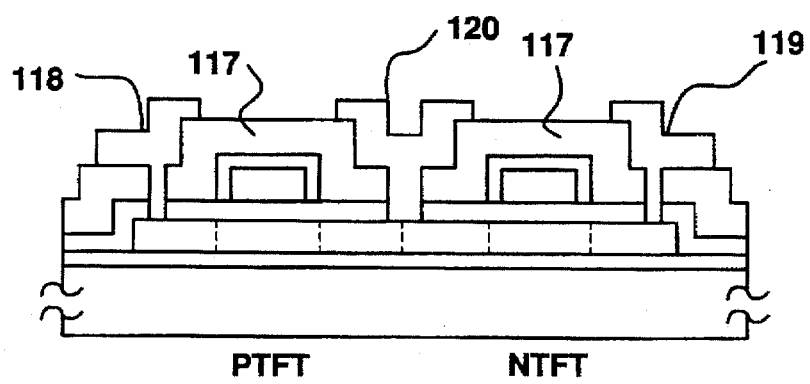

The present example is a complementary circuit consisting of a P-channel TFT (PTFT) and an N-channel TFT (NTFT) both of which use a crystalline silicon film formed on a glass substrate. The process sequence is schematically shown in FIGS. 1(A)–1(D). The circuit in the present example can be applied to switching elements for pixel electrodes of an active-matrix liquid crystal display, a peripheral driver circuit, an image sensor, and a three-dimensional integrated circuit.

First, an insulating bottom film 102 made of silicon oxide and having a thickness of 2000 Å was formed on a substrate 101 made of Corning 7059 glass by sputtering techniques. The substrate was annealed before or after the formation of the bottom film at a temperature higher than the strain temperature. Then, the temperature of the substrate was gradually lowered at a rate of 0.1 to 1.0° C./min below the strain temperature. This reduced shrinkage of the substrate during subsequent steps involving temperature elevation (including the step of irradiating infrared radiation according to the invention), and facilitated mask alignment. Where the substrate is made of Corning 7059 glass, it is annealed at 620°–660° C. for 1–4 hours, and then the substrate is slowly cooled at a rate of 0.1°–1.0° C./min, preferably 0.03°–0.3° C./min. When the temperature is lowered down to 400°–500° C., the substrate is taken out.

An intrinsic (I-type) amorphous (non-single-crystal) silicon film 103 having a thickness of 300–1500 Å, e.g., 800 Å, was formed by plasma CVD (PCVD). A silicon oxide film 104 having a thickness of 100–800 Å, e.g., 200 Å, was formed on the intrinsic amorphous silicon film 103 by PCVD. This would become a protective film in a later thermal annealing step and prevent the film surface from roughening.

The laminate was thermally annealed at 600° C. for 4 hours in a nitrogen ambient at atmospheric pressure. This thermal annealing drove off extra hydrogen atoms in the silicon film. The film showed low crystallinity. However, analysis by Raman spectroscopy has shown that the silicon film did not produce any peak clearly attributable to silicon crystals such as polycrystalline silicon films crystallized to more than 90%. In this state, at least nuclei contributing to growth of crystals were produced, and the area of the crystallized portion accounted for only less than 50%, typically 1–10%. Observation using a transmission electron microscope has revealed that microscopic crystals of less than 1000 Å, typically 20–100 Å, were present. In this step, the crystals were small. Previous implantation of silicon ions at a dose of $1\times10^{14}$ to $1\times10^{16}$ cm$^{-2}$ was effective in obtaining larger crystals which were about 3 to 30 times as large as the aforementioned crystals (FIG. 1(A)).

After this step, the silicon film was photolithographically patterned to form an active layer 105 of TFTs in the form of islands. The size of the islands of the active layer 105 was determined, taking account of the channel length and channel width of each TFT. Smaller islands of the active layer measured 50 µm by 20 µm. Larger ones measured 100 µm by 1000 µm. Such active layers were formed in quantities on the substrate.

Then, the laminate and also the patterned silicon island were irradiated with KrF excimer laser radiation having a wavelength of 248 nm and a pulse width of 30 nsec. Three to 20 shots of the laser radiation were emitted to crystallize the active layer. The energy density of the laser radiation was 200 to 450 mJ/cm$^2$. Where laser radiation having a comparatively low energy density of 100 to 200 mJ/cm$^2$ was emitted before the irradiation of the laser radiation of the above-described high energy, the uniformity of the crystallization of the film was improved.

Where the laser irradiation was conducted in a vacuum, greater advantages could be obtained. During the laser irradiation, when the substrate was heated to 150°–450° C., typically 200°–300° C., better characteristics and better uniformity were derived (FIG. 1(B)).

During the laser irradiation, a film of silicon oxide or silicon nitride is preferably formed as a protective film on the surface because this protective film improves the state of the silicon film 105. However, where transmission of laser radiation is taken into consideration, if KrF laser radiation of a short wavelength is used as in the present example, the use of the silicon nitride film is not appropriate. Where XeCl laser was employed, the use of the silicon nitride film presented no problems.

After the completion of the laser irradiation step described above, hydrogen annealing at 200°–500° C., typically at 350° C., was effective in reducing defects in the silicon film. The same advantage could be obtained by implanting hydrogen ions at a dose of $1\times10^{13}$ to $1\times10^{15}$ cm$^{-2}$ and thereafter making a thermal treatment at 200°–300° C.

After the laser irradiation, a silicon oxide film 106 having a thickness of 1000 Å was formed as a gate-insulating film by PCVD. TEOS (tetraethoxysilane (Si(OC$_2$H$_5$)$_4$)) and oxygen were used as gaseous raw materials in the PCVD. During the growth of the film, the substrate temperature was 300° to 550° C., e.g., 350° C.

Subsequently, an aluminum film having a thickness of 3000 to 8000 Å, e.g., 5000 Å, was formed by sputtering techniques. The aluminum contained 0.01 to 0.25% by weight of a rare-earth element belonging to group IIIa of the Periodic Table. The aluminum film was photolithographically patterned to form gate electrodes 107 and 109. The surfaces of the aluminum electrodes were anodized to form oxide layers 108 and 110 on the surfaces. This anodic oxidation was effected within an ethylene glycol solution containing 1 to 5% tartaric acid. The thickness of the obtained oxide layers 108 and 110 was 2000 Å. These oxide layers 108 and 110 determine the thickness of an offset gate region in a later ion doping step and so the length of the offset gate region can be determined in the anodic oxidation step.

Then, using a gate electrode portion (comprising the gate electrode 107, the surrounding oxide layer 108, the gate electrode 109, and the surrounding oxide layer 110) as a mask, an impurity was implanted into the silicon film 105 to impart conductivity type P or N by self-aligning techniques and by ion doping (also known as plasma doping). Phosphine ($PH_3$) and diborane ($B_2H_6$) were used as dopant gases. Where the phosphine was used, the accelerating voltage was 60 to 90 kV, e.g., 80 kV. Where diborane was used, the accelerating voltage was 40 to 80 kV, e.g., 65 kV. The dose was $1 \times 10^{15}$ to $8 \times 10^{15}/cm^2$. For example, phosphorus was implanted at a dose of $2 \times 10^{15}/cm^2$. Boron was implanted at a dose of $5 \times 10^{15}/cm^2$. During the implantation, one region was coated with a photoresist to selectively implant the elements. As a result, N-type doped regions 114, 116 and P-type doped regions 111, 113 were formed. In this way, a region for a P-channel TFT (PTFT) and a region for an N-channel TFT (NTFT) could be formed.

Thereafter, the laminate was annealed by irradiation of laser light. The laser light was emitted by a KrF excimer laser and had a wavelength of 248 nm and a pulse width of 20 nsec. Other lasers can also be used. The laser light was emitted at an energy density of 200 to 400 $mJ/cm^2$, e.g., 250 $mJ/cm^2$. Two to 10 shots of laser light were emitted per location. For example, two shots were emitted. During illumination of this laser light, where the substrate was heated to about 150° to 450° C., preferably 200° to 450° C., the effect could be enhanced (FIG. 1(C)).

Subsequently, a silicon oxide film 117 having a thickness of 400–8000 Å, e.g., 6000 Å, was formed as an interlayer insulator by PCVD. This interlayer insulator may also be made of either polyimide or a two-layer film consisting of silicon oxide and polyimide. Then, contact holes were formed. Electrodes and interconnects 118, 120, and 119 of TFTs were fabricated out of a metal material such as a multilayer film of titanium nitride and aluminum. Finally, the laminate was annealed at 350° C. for 30 minutes in a hydrogen ambient at 1 atm to complete semiconductor circuitry having complementary TFTs (FIG. 1(D)).

The circuitry described above is of the CMOS structure comprising complementary PTFT and NTFT. In the above step, it is also possible to fabricate the two TFTs simultaneously. Then, the substrate is cut at the center to obtain two independent TFTs at the same time.

EXAMPLE 2

The present example is an active-matrix liquid crystal display comprising N-channel TFTs which are formed at pixels as switching devices. In the description made below, only one pixel is described but many other (generally hundreds of thousands of) pixels are formed similarly. Obviously, the TFTs are not limited to N-channel TFTs. P-channel TFTs can also be used.

Figure 2A:
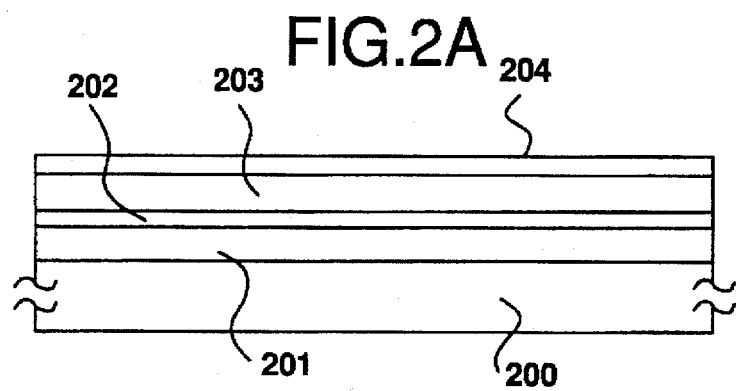
FIGS. 2(A)–2(D) are cross sections illustrating the fabrication sequence of Example 2 of a method according to the invention, for fabricating TFTs.
Figure 2B:
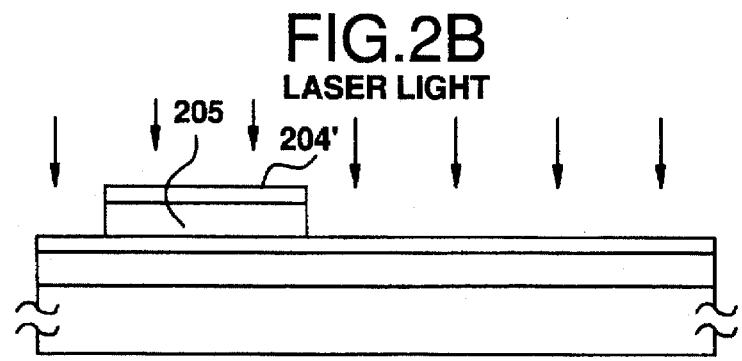
Figure 2C:
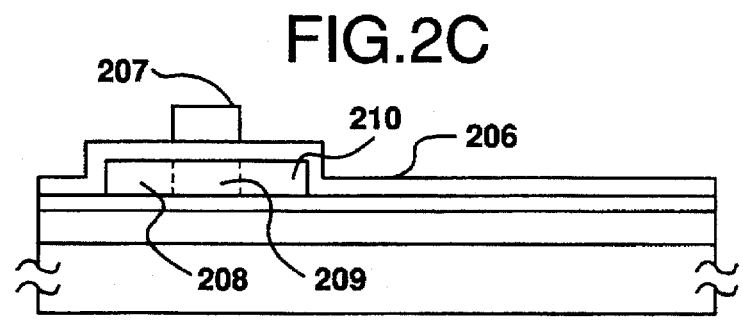
Figure 2D:
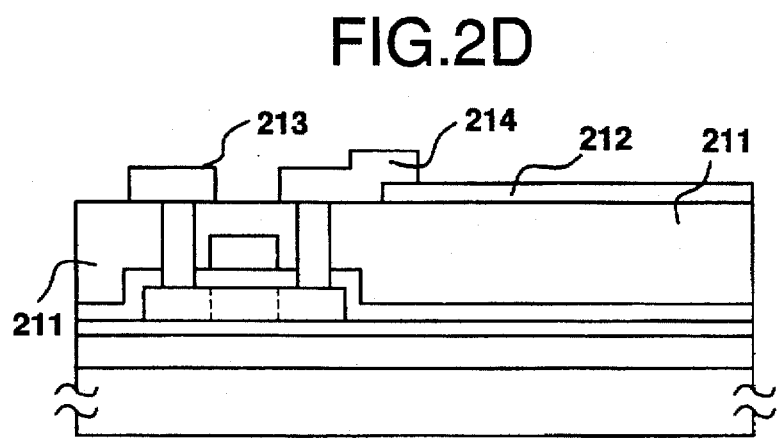

The process sequence of the present example is shown schematically in FIGS. 2(A)–2(D). In the present example, Corning 7059 glass was used as a substrate 200. This substrate had a thickness of 1.1 mm and measured 300 mm by 400 mm. First, an aluminum nitride film 201 was formed as a bottom film to a thickness of 2000 Å, by PCVD or sputtering techniques. As a second bottom film, a silicon oxide film 202 was formed to a thickness of 2000 Å by PCVD. Since the thermal conductivity of the aluminum nitride was ten or more times as high as the thermal conductivity of glass substrate, the aluminum nitride was helpful in maintaining the uniformity of temperature on the large-area substrate. In order to bring the coefficient of thermal expansion of the aluminum nitride close to that of the glass substrate and to improve the adhesiveness, 0.01–20 atomic % of oxygen may be added to the nitrogen.

Where the aluminum nitride is formed by PCVD, trimethyl-aluminum ($Al(CH_3)_3$) and ammonia may be used as raw materials. Where the aluminum nitride is formed by sputtering, reactive sputtering may be carried out in an ambient of nitrogen or ammonia, using an aluminum target. TEOS and oxygen were used as the gaseous raw materials for the CVD to form the silicon oxide film 202. Then, an amorphous silicon film 203 having a thickness of 1000 Å and a silicon oxide film 204 having a thickness of 200 Å were formed by LPCVD or PCVD. The laminate was thermally annealed at 600° C. for 1 hour, thus resulting in a silicon film of low crystallinity (FIG. 2(A)).

After the thermal annealing step, the silicon film was photolithographically patterned to leave only the islands of the active layer 205 of the TFTs and the overlying silicon oxide film 204'. The other portions were removed. The islands of the active layer 205 were irradiated with KrF laser radiation to enhance the crystallinity of the silicon film. Three to 20 shots of the laser radiation were emitted per location. The energy density was 200 to 450 $mJ/cm^2$ (FIG. 2 (S)).

Thereafter, the silicon oxide film 204' was removed to expose the surfaces of the islands of the silicon layer 205. Using TEOS as a gaseous raw material, a gate-insulating film of silicon oxide 206 was formed by PCVD in an oxygen ambient. The thickness of the gate-insulating film 206 was 70 to 120 nm, typically 120 nm. The substrate temperature was 350° C. A well-known film consisting mainly of polysilicon was formed by LPCVD and lithographically patterned to form gate electrodes 207. In order to improve the electrical conduction, 0.1–5 atomic % of phosphorus was added as a dopant to the polysilicon.

Then, phosphorus was implanted as an N-type dopant by ion doping, and a source region 208, a channel formation region 209, and a drain region 210 were formed simultaneously by self-aligning techniques. The laminate was irradiated with KrF laser light to repair the crystallinity of the silicon film which were deteriorated by the ion implantation. At this time, the energy density of the laser light was 250 to 300 $mJ/cm^2$. As a result of this laser irradiation, the sheet resistance of the source/drain regions of the TFTs assumed a value of 300 to 800 Ω/square. The laser annealing step may be replaced by lamp annealing making use of visible light or near-infrared light (FIG. 2(C)).

Thereafter, an interlayer insulator 211 was formed out of silicon oxide or polyimide. Then, a pixel electrode 212 was formed out of ITO. Contact holes were formed. Electrodes 213 and 214 were formed out of a multilayer film of chromium and aluminum in the source/drain regions of a TFT. One electrode 214 was connected also with the ITO pixel electrode 212. Finally, the laminate was annealed at 200°–400° C. for 2 hours within hydrogen to carry out hydrogenation. In this way, one TFT was completed. Similar steps were simultaneously carried out for many other pixel electrodes. To improve the moisture resistance, a passivation film of silicon nitride or the like may be formed over the whole surface (FIG. 2(D)).

The pixel transistors of the active-matrix construction of the present example are not required to operate at very high speeds. In the present example, therefore, in order to shorten the process time, the initial thermal annealing time is 1 hour, which is shorter than the thermal annealing time used in Example 1. In consequence, the silicon film obtained at the initial stage in the present example was inferior in crystallinity to the silicon film of Example 1. As a result, after the laser irradiation, the silicon film (FIG. 2(B)) was still somewhat inferior to the silicon film of Example 1 in crystallinity but had much better characteristics than silicon films formed by the ordinary SPC method.

EXAMPLE 3

Figure 3A:
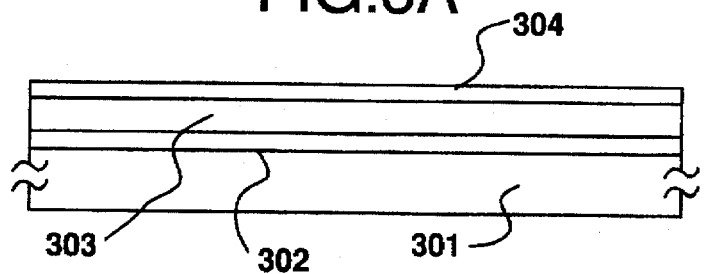
FIGS. 3(A)–3(E) are cross sections illustrating the fabrication sequence of Example 3 of a method according to the invention, for fabricating TFTs.
Figure 3B:
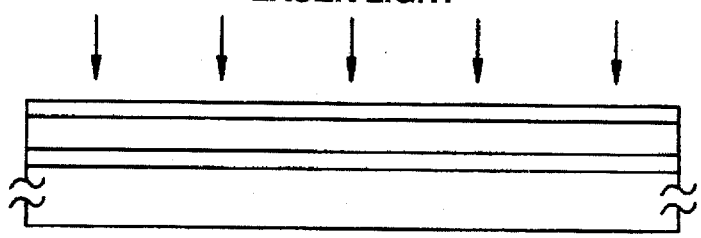
Figure 3C:
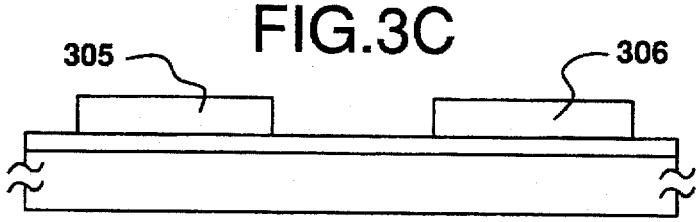
Figure 3D:
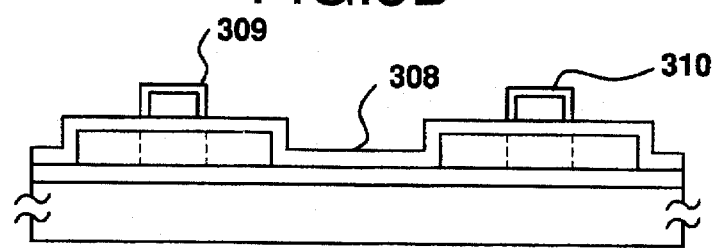
Figure 3E:
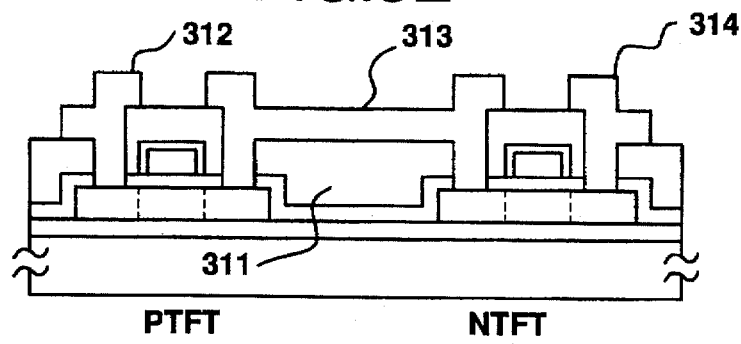

The present example is described now by referring to FIGS. 3(A)–3(E). A glass substrate having a glass transition point (also known as a strain point) of 550°–650° C., for example Corning 7059 glass, was used as a substrate 301. In the same way as in Example 1, to prevent shrinkage, the glass substrate was previously annealed at 640° C. for 4 hours. Then, the substrate was slowly cooled down to 450° C. at a rate of 0.1° C./min. Thereafter, the substrate was taken out and used. First, an insulating bottom film 302 was formed on the substrate 301. Then, an amorphous silicon film 303 having a thickness of 300–800 Å and a silicon oxide film 304 having a thickness of 200 Å were formed by PCVD. The laminate was thermally annealed at 620° C. for 1 hour so that the silicon film had a crystallinity of 0.1–99.9%.

After the thermal annealing, the laminate was rapidly cooled from the annealing temperature down to 450° C. at a rate of 2°–200° C./sec, preferably more than 10° C./s to prevent the laminate from shrinking. If the used heating furnace does not permit this rapid cooling, then the same advantage can be obtained by taking the substrate out of the furnace and maintaining the substrate at room temperature.

In the present example, since the thermal annealing temperature was higher than the temperatures used in Examples 1 and 2 and than the strain point (593° C.) of the Corning 7059 glass, it was difficult to suppress shrinkage even if previous heat treatment and slow cooling were carried out. In this case, rapid cooling from the annealing temperature described above produces desirable effects. In the present example, since the annealing temperature was high, a silicon film having relatively high crystallinity (more than 50%) was obtained although the annealing time was shorter than the annealing time used in Example 1 (FIG. 3(A)).

Then, 3 to 20 shorts of KrF excimer laser radiation having a wavelength of 248 nm and a pulse width of 30 nsec were irradiated to the thermally annealed silicon film to promote crystallization of the active layer. The energy density of the laser radiation was 200 to 450 mJ/cm$^2$ (FIG. 3(B)).

Then, the silicon film 303 was photolithographically patterned to form active layer regions 305 and 306 in the form of islands. The active layer regions were etched by RIE (reactive ion etch) having vertical anisotropy (FIG. 3(C)).

Thereafter, a gate-insulating film 308 and gate electrodes 309, 310 were formed, in the same way as in Example 1. Doped regions were formed by ion doping and activated by laser irradiation (FIG. 3(D)).

Thereafter, an interlayer insulator 311 was formed, and contact holes were formed in the insulator. Metallic interconnects 312, 313, and 314 were formed (FIG. 3(E)).

In this way, a complementary TFT circuit was completed. In the present example, before the silicon film was photolitho-graphically patterned to form the active layer in the form of islands, the film was crystallized by laser irradiation (FIG. 3(B)). This was effective in protecting the active layer of the TFTs against contamination. However, in order to carry out the laser irradiation before the patterning of the active layer in this way, it is necessary that the crystallinity of the silicon film be comparatively high. In the case of a silicon film of low crystallinity, it is not highly transparent to UV laser radiation and so absorption of laser radiation energy is concentrated in the vicinities of the surface and grain boundaries, so that the film may peel off or other undesirable situation occur.

Conversely, a film satisfying these requirements is prevented from being contaminated. Therefore, TFTs according to the present example had quite excellent characteristics (i.e., field mobility and threshold voltage) and reliability. As can be seen from the present example, the present invention is embodied especially advantageously where the glass transition point of the substrate is 550°–650° C.

According to the present invention, a thermal anneal is conducted at 400°–620° C., preferably at 520°–620° C., more preferably at 550°–600° C., for 1–12 hours to crystallize a silicon film to a crystallinity of 0.1–99.9%, preferably 1–99%. The silicon film is irradiated with UV laser radiation, whereby the crystallinity can be improved. A silicon film having good crystallinity can be derived stably. The characteristics of the silicon film can be enhanced further, by carrying out a hydrogenating thermal anneal of the silicon film at 200°–450° C. in a hydrogen ambient or by hydrogen ion doping so as to implant a hydrogen atom into the silicon film so that dangling bonds can be removed or neutralized. The neutralization by the hydrogenating thermal anneal or by the hydrogen ion doping is carried our after the UV laser irradiation step. Furthermore, the present invention shortens the crystallization step which would have been heretofore required tens of hours to carry out. Hence, the mass production can be more easily effected. In this way, the invention is industrially advantageous. The invention is especially useful for formation of insulated-gate semiconductor devices.

What is claimed is:

1. A method of fabricating a semiconductor device comprising the steps of:

forming a passivation fill comprising aluminum nitride on a glass substrate;

forming a non-single-crystal silicon fill over said passivation fill; and crystallizing said non-single crystal silicon film, wherein said passivation fill contains oxygen at 0.01 to 20 atomic % with respect to nitrogen contained therein.

2. The method of claim 1 further comprising the step of forming an insulating fill comprising silicon oxide between said passivation fill and said non-single crystal silicon fill.

3. The method of claim 1 further comprising the step of implanting a silicon ion at a dose of $1\times10^{14}$ to $1\times10^{16}$ cm$^{-2}$ into said non-single crystal silicon fill before the step of crystallizing.

4. The method of claim 1 further comprising the step of neutralizing a dangling bond in said silicon fill after the step of crystallizing by thermally annealing said silicon fill at a temperature of 200°–450° C. in a hydrogen atmosphere or by hydrogen ion doping so as to implant a hydrogen atom into said silicon film.

5. The method of claim 1 further comprising the step of forming a thin film transistor over said glass substrate by utilizing said non-single crystal silicon film.

6. The method of claim 1 wherein the step of crystallizing is carried out by heating said non-single crystal silicon film.

7. The method of claim 6 wherein the step of crystallizing further comprises a step of irradiating said non-single crystal silicon film after the heating.

8. The method of claim 7 wherein said irradiating step is carried out with said substrate being heated at a temperature of 150°–450° C.

9. A method of fabricating a semiconductor device comprising the steps of:

forming a passivation film comprising aluminum nitride on a glass substrate;

forming a non-single-crystal silicon film over said passivation film;

thermally annealing said non-single-crystal silicon film at an annealing temperature of 400°–620° C. so that said silicon film has a crystallinity of 0.1–99.9%;

patterning the thermally annealed silicon film into an island; and irradiating the patterned silicon island with ultraviolet laser radiation, wherein said passivation film contains oxygen at 0.01 to 20 atomic % with respect to nitrogen contained therein.

10. The method of claim 9 further comprising the step of neutralizing a dangling bond in said silicon island after said irradiating step by thermally annealing said silicon island at a temperature of 200°–450° C. in a hydrogen atmosphere or by hydrogen ion doping so as to implant a hydrogen atom into said silicon island.

11. The method of claim 9 wherein said ultraviolet laser radiation is emitted from KrF excimer laser, XeCl excimer laser, ArF excimer laser, or XeF excimer laser.

12. The method of claim 9 wherein said irradiating step is carried out in a vacuum.

13. The method of claim 9 wherein said irradiating step is carried out with said substrate being heated at a temperature of 150°–450° C.

14. The method of claim 9 wherein said non-single-crystal silicon film comprises an amorphous silicon.

15. A method of fabricating a semiconductor device comprising the steps of:

forming a passivation film comprising aluminum nitride on a glass substrate;

forming a non-single-crystal silicon film over said passivation film;

thermally annealing said non-single-crystal silicon film at an annealing temperature of 400°–620° C. so that said silicon film has a crystallinity of 0.1–99.9%;

irradiating the thermally annealed silicon film with ultraviolet laser radiation; and patterning the silicon film into an island after said irradiating step, wherein said passivation film contains oxygen at 0.01 to 20 atomic % with respect to nitrogen contained therein.

16. The method of claim 15 wherein said ultraviolet laser radiation is emitted from KrF excimer laser, XeCl excimer laser, ArF excimer laser, or XeF excimer laser.

17. The method of claim 15 wherein said irradiating step is carried out in a vacuum.

18. The method of claim 15 wherein said irradiating step is carried out with said substrate being heated at a temperature of 150°–450° C.

19. The method of claim 15 wherein said non-single-crystal silicon film comprises an amorphous silicon.

* * * * *